United States Patent [19]

Narabu et al.

[11] Patent Number: 5,087,843
[45] Date of Patent: Feb. 11, 1992

[54] INPUT CIRCUIT FOR CCD DELAY LINE

[75] Inventors: Tadakuni Narabu; Hisanori Miura, both of Kanagawa, Japan

[73] Assignee: Sony Corporation, Tokyo, Japan

[21] Appl. No.: 575,381

[22] Filed: Aug. 30, 1990

[30] Foreign Application Priority Data

Sep. 1, 1989 [JP] Japan .................. 1-226749

[51] Int. Cl.⁵ .................. H03K 5/13; G06G 7/12; G11C 19/28; H01L 29/78
[52] U.S. Cl. .................. 307/607; 307/491; 307/494; 307/359; 328/66; 377/58; 357/24
[58] Field of Search .............. 307/607, 597, 491, 494, 307/353, 359; 328/66; 377/57, 58, 59, 60; 375/9; 357/24

[56] References Cited

U.S. PATENT DOCUMENTS 4,625,322  11/1986  Tukazaki et al. .................. 377/58

FOREIGN PATENT DOCUMENTS 2604820  4/1988  France .

Primary Examiner—Stanley D. Miller
Assistant Examiner—Trong Phan
Attorney, Agent, or Firm—Hill, Van Santen, Steadman & Simpson

[57] ABSTRACT

An input circuit for a charge-coupled device (CCD) delay line is comprised of a semiconductor substrate, a CCD delay line formed on the semiconductor substrate, first and second registers each having substantially the same maximum treating charge amount as that of the CCD delay line and formed on the semiconductor substrate, an input portion of the first register having substantially the same structure as that of the CCD delay line, output portions of the first and second registers having substantially the same structure each other, a control circuit for controlling the second register so that an output signal from the second register becomes a signal corresponding to the maximum treating charge amount, a comparing circuit for comparing output signals of the first and second registers, wherein an output signal of the comparing circuit is fed back to an input source of the input portion of the first register so that the output signal from the first register becomes equal to the output signal from the second register, a voltage of high level of a clock signal is supplied to an input gate of the first register and a voltage of the input source of the first register is supplied to an input source of an input portion of the CCD delay line. Thus, an overflow of charge can be avoided satisfactorily.

8 Claims, 3 Drawing Sheets

INPUT CIRCUIT FOR CCD DELAY LINE

BACKGROUND OF THE INVENTION

1. Field of the Invention

The present invention generally relates to a charge-coupled device (i.e. CCD) delay device which is used to delay an analog signal such as a video signal or the like and, more particularly, is directed to an input circuit for a CCD delay line.

2. Description of the Prior Art

A recent television receiver or the like utilizes a CCD delay device formed of a CCD delay line to delay an analog signal such as a video signal and so on. In the CCD delay line of the gate input type, when an input signal of a large level (e.g., level slightly higher than the level corresponding to the maximum amount of charges that the CCD delay line can treat) is supplied thereto, an overflow of charges occurs in a charge transfer portion of the CCD delay line, which leads to various disadvantages. In order to avoid the charge overflow, it is proposed in the prior art to limit the level of the input signal by a limiter circuit provided independently of the CCD delay device.

However, in accordance with this previously-proposed method in which the limiter circuit is provided independently of the CCD delay line to limit the level of the input signal, the maximum amount of charges treated by the CCD delay line is different depending on the characteristic of the CCD delay line so that the limiting level of the limiting circuit must be adjusted in response to CCD delay lines, which is very cumbersome.

Furthermore, the CCD delay line has a temperature characteristic such that when the temperature is changed, the level K controlled by the limiting circuit and the maximum treating charge amount input to the CCD delay line are not equal to each other to generate a difference. This difference will cause the overflow of charge if the change of temperature is too large.

OBJECTS AND SUMMARY OF THE INVENTION

Accordingly, it is an object of the present invention to provide an improved input circuit for a CCD delay line in which the aforenoted shortcomings and disadvantages of the prior art can be eliminated.

More specifically, it is another object of the present invention to provide an input circuit for a CCD delay line in which an overflow of charges can be avoided satisfactorily.

It is still another object of the present invention to provide an input circuit for a CCD delay line which is for use in delaying an analog signal such as a video signal or the like.

As an aspect of the present invention, an input circuit for a charge-coupled device (CCD) delay line is comprised of a semiconductor substrate, a CCD delay line formed on the semiconductor substrate, first and second registers each having substantially the same maximum treating charge amount as that of the CCD delay line and formed on the semiconductor substrate, an input portion of the first register having substantially the same structure as that of the CCD delay line, output portions of the first and second registers having substantially the same structure with respect to each other, a control circuit for controlling the second register so that an output signal from the second register becomes a signal corresponding to the maximum treating charge amount, a comparing circuit for comparing output signals of the first and second registers, and wherein an output signal of the comparing circuit is fed back to an input source of the input portion of the first register so that the output signal from the first register becomes equal to the output signal from the second register, a voltage of high level of a clock signal being supplied to an input gate of the first register and a voltage of the input source of the first register being supplied to an input source of an input portion of the CCD delay line. Thus, an overflow of charge can be avoided satisfactorily.

The preceding and other objects, features and advantages of the present invention will become apparent from the following detailed description of the preferred embodiments thereof to be taken in conjunction with the accompanying drawings, in which like reference numerals identify the same or similar elements.

BRIEF DESCRIPTION OF THE DRAWINGS

The following detailed description, given by way of example, and not intended to limit the present invention solely thereto, will best be understood in conjunction with the accompanying drawings in which.

DETAILED DESCRIPTION OF PREFERRED EMBODIMENTS

The present invention will be described hereinafter with reference to the drawings.

Figure 1:
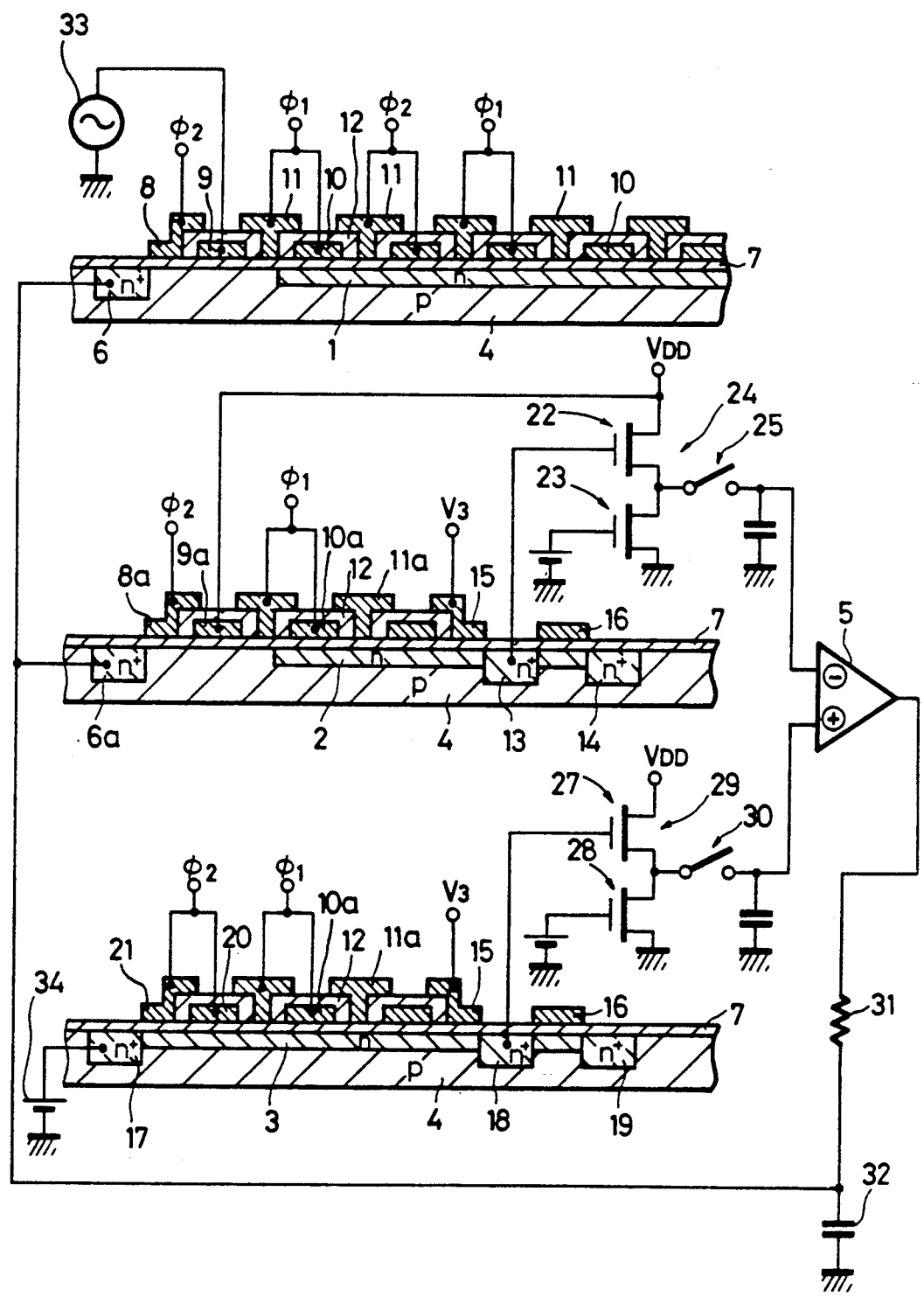
FIG. 1 is a cross-sectional view illustrating an embodiment of an input circuit for a CCD delay line according to the present invention.
Figure 2:
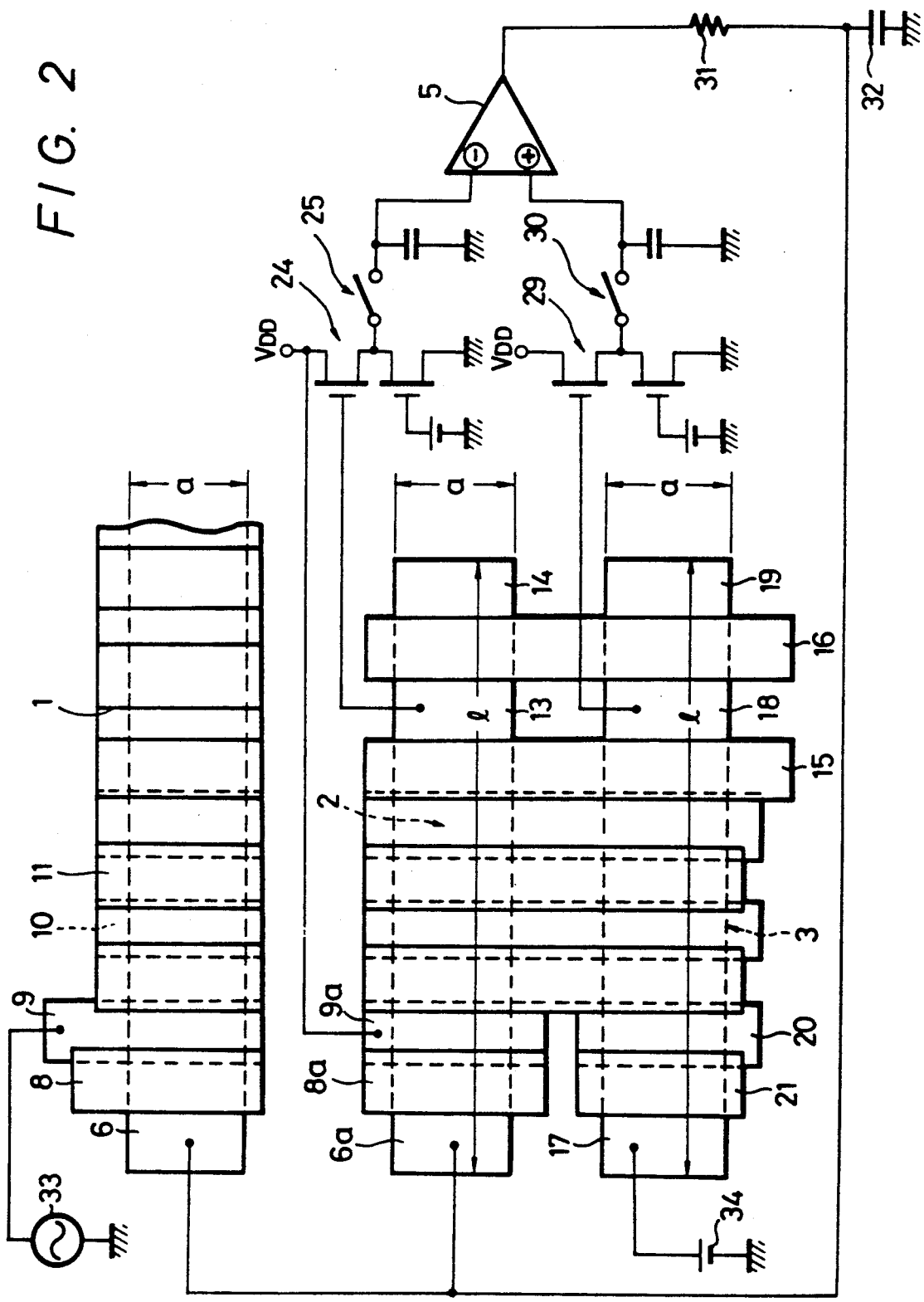
FIG. 2 is a plan view of FIG. 1.

FIG. 1 shows a cross-sectional view of a first embodiment of the input circuit for a CCD delay line according to the present invention, and FIG. 2 shows a plan view thereof.

In FIGS. 1 and 2, reference numeral 4 designates a P-type silicon semiconductor substrate. The P-type silicon semiconductor substrate 4 has formed thereon a CCD delay line 1 through which a signal charge is transferred. The length of the CCD delay line 1 is determined in accordance with a delay time. Further, on the P-type silicon semiconductor substrate 4, there are formed a first register 2 having the same width a as the width a of the CCD delay line 1 and which has a predetermined length l an a second register 3 having the same width a and the same length l as those of the first register 2. In that case, the widths a of the first and second registers 2 and 3 are selected to be equal to the width a of the CCD delay line 1 as mentioned above, and the maximum amounts of charges treated by the first and second registers 2 and 3 and the CCD delay line 1 are selected equal. The CCD delay line 1 in this embodiment is formed of an n-channel BCCD (buried channel CCD) of a double layer electrode structure which is operated in a two-phase system. The CCD delay line 1 and the first and second registers 2 and 3 are each formed of an n layer formed on the surface of the P-type silicon semiconductor substrate 4.

An input source region 6 of the n+ layer is formed on one end of the input portion of the CCD delay line 1. On the CCD delay line 1, there are formed through an insulating layer 7 made of $SiO_2$ first and second input gate electrodes 8 and 9 made of impurity-doped polycrystalline silicon, and a number of transfer electrodes 10 forming a first layer and a number of transfer electrodes 11 forming a second layer. The transfer electrodes 10 and 11 forming the first and second layers and the first and second input gate electrodes 8 and 9 are electrically insulated by interlayer insulating layers 12 made of $SiO_2$.

An input portion of the first register 2 is constructed substantially the same as that of the CCD delay line 1. The input portion of the first register 2 has formed at one end thereof an input source region 6a which is the same as the input source region 6 of the CCD delay line 1. The first register 2 has formed thereon through an $SiO_2$ insulating layer 7 first and second input gate electrodes 8a and 9a each of which is made of impurity-doped polycrystalline silicon, a transfer electrode 10a forming a first layer and a transfer electrode 11a forming a second layer. The transfer electrodes 10a and 11a forming the first and second layers, and the first and second input gate electrodes 8a and 9a, are electrically insulated by interlayer insulating layers 12 made of $SiO_2$. The transfer electrodes 10a and 11a of the first and second layers are extended on the second register 3 so as to serve as transfer electrodes of first and second layers of the second register 3.

An output portion of the first register 2 has formed on the other end thereof a floating diffusion layer 13 made of an n+ layer. Further, a pre-charge drain region 14 is formed in the P-type silicon semiconductor substrate 4 at its portion distant from the floating diffusion layer 13 by a predetermined spacing. The first register 2 has formed thereon, in addition to the first and second input gate electrodes 8a and 9a and the transfer electrodes 10a and 11a forming the first and second layers, an output gate electrode 15 and a pre-charge gate electrode 16, each of which is made of impurity-doped polycrystalline silicon. In that case, the output gate electrode 15 and the pre-charge gate electrode 16 are extended up to the second register 3 so as to serve as an output gate electrode and a pre-charge gate electrode of the second register 3.

An input source region 17 of an n+ layer is formed on the input portion at one end of the second register 3. A floating diffusion region 18, which is the same as the floating diffusion region 13 of the first register 2, is formed on the output portion at the other end of the second register 3. A pre-charge drain region 19, which is the same as the pre-charge drain region 14 of the first register 2, is formed distant from the floating diffusion region 18 by a predetermined spacing. The second register 3 has formed thereon, in addition to the transfer electrodes 10a and 11a forming the first and second layers, the output gate electrode 15 and the pre-charge gate electrode 16, and transfer electrodes 20 and 21 of first and second layers made of impurity-doped polycrystalline silicon at the positions corresponding to the first and second input gate electrodes 8a and 9a of the first register 2.

The pre-charge drain regions 14 and 19 of the first and second registers 2 and 3 are used to accumulate charges of the floating diffusion regions 13 and 18 in association with the opening and closing operation of switches 25 and 30 which will be described later. The accumulation of charges is controlled by the pre-charge gate electrode 16.

The floating diffusion region 13 of the first register 2 is connected through a source follower transistor 24 formed of metal-oxide-semiconductor field-effect transistors (i.e., MOSFETs) 22 and 23 and the switch 25 to an inverting input terminal $\ominus$ of an operational amplifying circuit 5 which forms a comparing circuit. Similarly, the floating diffusion region 18 of the second register 3 is connected through a source follower transistor 29 formed of MOSFETs 27 and 28 and the switch 30 to a non-inverting input terminal $\oplus$ of the operational amplifying circuit 5 which forms the comparing circuit.

An output terminal of the operational amplifying circuit 5 is grounded via a series circuit of a resistor 31 and a capacitor 32, and a junction between the resistor 31 and the capacitor 32 is coupled to the input source region 6a of the first register 2. That is, a compared output signal from the operational amplifying circuit 5 is fed back to the input source region 6a of the first register 2.

In this embodiment, an input signal source 33 is connected to the second input gate electrode 9 of the CCD delay line 1, and the second input gate electrode 9a of the first register 2 is supplied with a voltage provided when a clock signal is at a high level, for example, a power source voltage $V_{DD}$ of 5 Volts.

Further, in this embodiment, the input source region 17 of the second register 3 is coupled with a battery 34 which generates a dc voltage. The voltage of the battery 34 is selected to be a voltage such that charges equal to the maximum treating charge amount of the second register 3, i.e., charges equal to the maximum treating charge amount of the CCD delay line 1, may always be transferred to the second register 3.

The charge transfers of the CCD delay line 1 and the first and second registers 2 and 3 are performed by supplying predetermined two-phase clock signals $\phi 1$ and $\phi 2$ to the pairs of the transfer electrodes 10, 10a and 20 of the first layer and the transfer electrodes 11, 11a and 21 of the second layer in a predetermined sequential order.

The transfer direction of charges is determined by changing a concentration of impurities in the semiconductor substrate 4 beneath low the transfer electrodes 10, 10a, 20 of the first layer and the transfer electrodes 11, 11a, 21a of the second layer to form asymmetric potential wells.

In this embodiment, the voltage supplied to the input source region 6a of the first register 2 is supplied to the input source region 6 of the CCD delay line 1.

The first input gate electrodes 8 and 8a of CCD delay line 1 and the first register 2 are supplied with the clock signal $\phi 2$ whose phase is different from that of the clock signal $\phi 1$ that is supplied to the transfer electrodes 11, 10, 11a and 10a of the output side of the second input gate electrodes 9 and 9a.

The input circuit for the CCD delay line of this embodiment is constructed as set out above. According to this embodiment, a charge transferred through the second register 3 and arriving at the floating diffusion region 18 is converted into a voltage by the source follower transistor 29 and is then sampled and held by the switch 30. As described above, the operational amplifying circuit 5 is supplied at the non-inverting input terminal $\oplus$ thereof with the voltage of a magnitude which corresponds to the maximum treating charge amount of the second register 3, i.e. the voltage of a magnitude corresponding to the maximum treating charge amount of the CCD delay line 1.

In the early stage of operation, no charge exists in the first register 2 so that the voltage supplied to the inverting input terminal ⊖ of the differential amplifying circuit 5 goes high in level. A feedback voltage of magnitude corresponding to the difference between the voltages supplied to the non-inverting input terminal ⊕ and the inverting input terminal ⊖ of the operational amplifying circuit 5 is supplied to the input source region 6a of the first register 2 from the output terminal of the operational amplifying circuit 5, whereby the charge amount of the input source region 6a is made predetermined by this feedback voltage. Under this condition, the clock signal $\phi 2$ is supplied to the first input gate electrode 8a of the first register 2; and the voltage $V_{DD}$, provided when the clock signals $\phi 1$ and $\phi 2$ are at high level, is supplied to the second input gate electrode. Thus charge is transferred to the first register 2 formed under the transfer electrodes 10a and 11a of the first and second layers. The charge thus transferred is finally transferred to the floating diffusion region 13 via the transfer electrodes 10a and 11a forming the first and second layers. In that case, since the transfer electrodes 10a and 11a of the first and second layers and the output gate electrode 15 are made common to the first and second registers 2 and 3, the charge of the same amount as the maximum treating charge amount of the second register 3 is transferred to the floating diffusion region 18 of the second register 3 at the same timing in which the charge is transferred to the floating diffusion region 13 of the first register 2.

The charges respectively transferred to the floating diffusion region 13 of the first register 2 and the floating diffusion region 18 of the second register 3 are converted into voltages by the source follower transistors 24 and 29, respectively, and are sampled and then held at the same timing so that the operational amplifying circuit 5 is supplied at the inverting input terminal ⊖ thereof with the voltage of a magnitude corresponding to the amount of charges transferred through the first register 2, and is also supplied at the non-inverting input terminal ⊕ thereof with the voltage of a magnitude corresponding to the maximum treating charge amount of the second register 3. The operational amplifying circuit 5 generates at the output terminal thereof a feedback voltage corresponding to a difference between the voltages supplied to the inverting input terminal ⊖ and the non-inverting input terminal ⊕ thereof. The amount of charges accumulated in the input source region 6a of the first register 2 is controlled by the feedback voltage from the output terminal of the operational amplifying circuit 5.

As described above, the feedback voltage is generated from the output terminal of the operational amplifying circuit 5 so that the amount of charges transferred through the first register 2 may become equal to the amount of charges transferred through the second register 3. Then, this feedback voltage is supplied to the input source region 6a of the first register 2.

Therefore, in the stationary state, the amount of charges transferred through the first register 2 is always kept equal to the maximum amount of charges transferred through the second register 3.

The voltage supplied to the input source region 6a of the first register 2 is supplied to the input source region 6 of the CCD delay line 1, whereby the voltage of the input source region 6 of the CCD delay line 1 serves as a source for providing the charge amount equal to the maximum treating charge amount of the first register 2. Thus, regardless of the magnitude of the input signal supplied to the second input gate electrode 9 of the CCD delay line 1, charges of an amount larger than the maximum treating charge amount are inhibited from being supplied to the charge transfer portion of the CCD delay line 1, thereby avoiding the overflow of charge in the charge transfer portion of the CCD delay line 1.

Further, the input structures of the CCD delay line 1 and the first register 2 are made the same and the output structures of the first and second registers 2 and 3 are also made the same on the common semiconductor substrate 4 so that, when the temperature is changed, the input portion of the CCD delay line 1 and the input portion of the first register 2 are both affected in the same fashion and the output portion of the first register 2 and the output portion of the second register 3 are both affected in the same fashion. Therefore, it is possible to prevent the charges of the charge transfer portion of the CCD delay line 1 from being overflowed due to the change of temperature.

In the above-described embodiment, the charges transferred to the floating diffusion regions 13 and 18 of the first and second registers 2 and 3 are converted into the voltages by the source follower transistors 24 and 29, and these voltages are compared in level by the operational amplifying circuit 5, which might be modified as follows.

Figure 3:
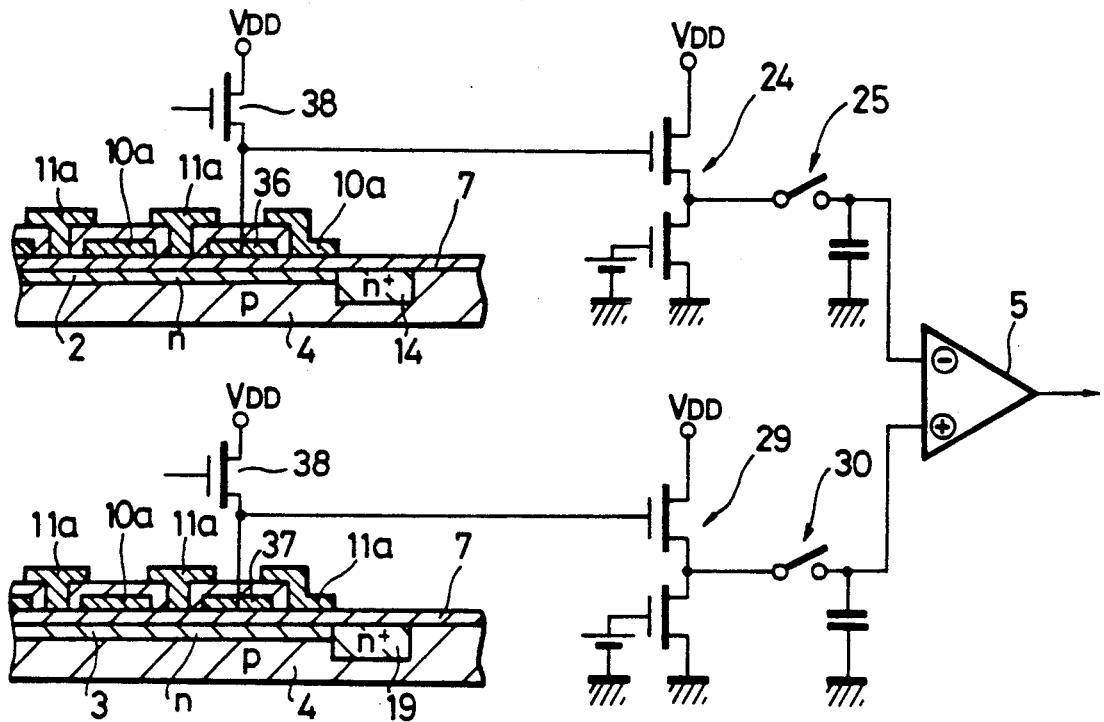
FIG. 3 is a cross-sectional view illustrating a modified example of a main portion of the input circuit for a CCD delay line according to the present invention.

FIG. 3 shows a modified example of FIG. 1, and in FIG. 3, like parts corresponding to those of FIG. 1 are marked with the same references and therefore need not be described in detail.

As shown in FIG. 3, floating gate electrodes 36 and 37 made of polycrystalline silicon are respectively formed on the first and second registers 2 and 3 via the insulating layer 7, and these floating gate electrodes 36 and 37 are connected to the source follower transistors 24 and 29, respectively. In that case, the charges transferred through the first and second registers 2 and 3 can be detected as image charges generated in the floating gate electrodes 36 and 37. A MOSFET 38 is employed as a reset switch, and the potential of the floating gate electrode 36 is controlled by turning ON or OFF this reset switch. The charges in the floating gate electrodes 36 and 37 are converted into the voltages by the source follower transistors 24 and 29 and the two voltages are compared in level by the operational amplifying circuit 5 similarly as described above.

Figure 4:
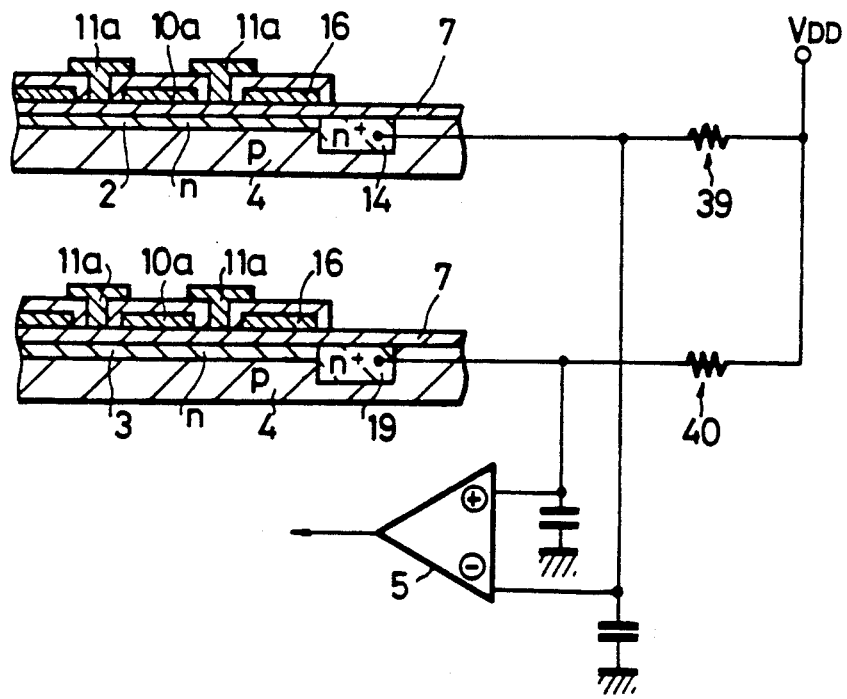
FIG. 4 is a cross-sectional view illustrating a further modified example of the main portion of the present invention.

The main portion of this invention may be further modified. As, for example, shown in FIG. 4, resistors 39 and 40 are respectively connected between the precharge drain regions 14, 19 and the voltage source $V_{DD}$, and voltage drops thereacross are compared by the operational amplifying circuit 5.

While in the above-mentioned embodiment the CCD delay line is formed of the n-channel BCCD of a double-layer structure which is operated in a two-phase system, the present invention is not limited thereto. It is, needless to say that a CCD delay line formed of a surface channel CCD or CCD delay line formed of three-phase or multi-phase structure CCD delay line can be employed. Further, it is possible to employ a CCD delay line of single electrode structure or a CCD delay line formed of a multi-layer electrode structure of more than three layers.

According to the present invention, since the voltage supplied to the input source of the CCD delay line 1 serves as the source for supplying charges of the amount equal to the maximum amount of charges treated by the transfer portion of the CCD line 1, the upper limit of charges transferred to the transfer portion of the CCD delay line 1 becomes the maximum treating charge amount. There is then the substantial advantage that, even when the large input signal is supplied, the overflow of charges can be avoided.

Furthermore, since the first and second registers 2 and 3 for determining the voltage of the input source of the CCD delay line 1 are formed on the same semiconductor substrate 4 on which the CCD delay line 1 is also formed, the CCD delay line 1 and the first and second registers 2 and 3 are affected in the same fashion due to the change of temperature. Therefore, regardless of the change of temperature, the overflow of charge can be avoided in the charge transfer portion of the CCD delay line 1.

Having described preferred embodiments of the invention with reference to the accompanying drawings, it is to be understood that the present invention is not limited to those precise embodiments and that various changes and modifications thereof could be effected by one skilled in the art without departing from the spirit or scope of the novel concepts of the invention as defined in the appended claims.

We claim as our invention:

1. A charge-coupled device delay line system, comprising:

a semiconductor substrate;

a CCD delay line on the substrate having a set of transfer electrodes, an input portion having an input source, and having a maximum treating charge amount;

first and second registers on the substrate each having a set of transfer electrodes and having substantially the same maximum treating charge amount as that of said CCD delay line, said first and second registers each having an input portion with an input gate and an input source, the input portion of the first register being formed to have substantially a same structure as that of said input portion of said CCD delay line, and each of said first and second registers having output portions which are formed to have substantially a same structure as each other;

control means connected to the second register for controlling it such that an output signal from the second register corresponds to said maximum treating charge amount of the CCD delay line;

comparing means for comparing an output signal of the first register and the output signal of the second register and for producing a feedback signal;

means for feeding back the feedback signal of said comparing means to said input source of the input portion of said first register so that the output signal from the first register becomes substantially equal to the output signal from the second register and the amount of charges transferred through the first register is made substantially equal to the amount of charges transferred through the second register;

means for supplying to the input gate of the input portion of said first register a substantially constant voltage at least as high as a high level of a clock signal supplied to the CCD delay line transfer electrodes; and means for supplying a voltage at the input source of the first register to the input source of the CCD delay line, whereby charge overflow in the CCD delay line can be avoided.

2. A system according to claim 1 wherein said semiconductor substrate is a p-type silicon substrate.

3. A system according to claim 1 wherein a width of said CCD delay line is substantially the same as a width of the first and second registers.

4. A system according to claim 1 wherein said CCD delay line is an n-channel buried CCD of double layer electrode structure.

5. A system according to claim 1 wherein said comparing means is an operational amplifying circuit.

6. A system according to claim 1 wherein said control means is connected to the input source region of the input portion of the second register.

7. A system according to claim 6 wherein said control means comprises a voltage source connected to the input source region.

8. A charged-coupled device delay line system, comprising:

a CCD delay line having a set of transfer electrodes, an input and output, and having a maximum treating charge amount, beyond which charge overflow occurs;

first and second registers each having a set of transfer electrodes and having substantially the same maximum treating charge amount as that of said CCD delay line, said first and second registers each having an input and an output;

control means connected to the input of the second register for controlling it such that an output signal from the second register corresponds to said maximum treating charge amount of the CCD delay line;

comparing means for comparing an output signal of the first register and the output signal of the second register and for producing a feedback signal;

means for feeding back the feedback signal of said comparing means to said input of said first register so that the output signal from the first register becomes substantially equal to the output signal from the second register and the amount of charges transferred through the first register is made substantially equal to the amount of charges transferred through the second register;

means for supplying to said input gate of the input portion of said first register a substantially constant voltage at least as high as a high level of a clock signal supplied to the CCD delay line transfer electrodes; and means for supplying a voltage at the input of the first register to the input of the CCD delay line, whereby charge overflow in the CCD delay line can be avoided.

* * * * *